(12) United States Patent
Steines et al.

(10) Patent No.: US 9,687,945 B2
(45) Date of Patent: *Jun. 27, 2017

(54) FUSION OF MULTIPLE IMAGING PLANES FOR ISOTROPIC IMAGING IN MRI AND QUANTITATIVE IMAGE ANALYSIS USING ISOTROPIC OR NEAR-ISOTROPIC IMAGING

(71) Applicant: ConforMIS, Inc., Bedford, MA (US)

(72) Inventors: Daniel Steines, Lexington, MA (US); Bijan Timsari, San Diego, CA (US); Konstantinos Tsougarakis, Sunnyvale, CA (US); Philipp Lang, Lexington, MA (US)

(73) Assignee: ConforMIS, Inc., Billerica, MA (US)

( * ) Notice: Subject to any disclaimer, the term of this patent is extended or adjusted under 35 U.S.C. 154(b) by 392 days.

This patent is subject to a terminal disclaimer.

(21) Appl. No.: 14/148,511

(22) Filed: Jan. 6, 2014

(65) Prior Publication Data
US 2014/0115872 A1 May 1, 2014

Related U.S. Application Data

(63) Continuation of application No. 13/345,843, filed on Jan. 9, 2012, now Pat. No. 8,638,998, which is a
(Continued)

(51) Int. Cl.
*G06K 9/00* (2006.01)
*B23P 19/00* (2006.01)
(Continued)

(52) U.S. Cl.
CPC ............ *B23P 19/00* (2013.01); *G01R 33/56* (2013.01); *G01R 33/5608* (2013.01); *Y10T 29/49* (2015.01)

(58) Field of Classification Search
CPC .................................. G06K 9/00; G01R 33/00
(Continued)

(56) References Cited

U.S. PATENT DOCUMENTS

| 5,245,282 A | 9/1993 | Mugler, III et al. .......... 324/309 |
| 5,282,868 A | 2/1994 | Bahler ............................ 623/20 |

(Continued)

FOREIGN PATENT DOCUMENTS

| WO | WO 01/70142 | 9/2001 | ............... A61F 2/38 |
| WO | WO 01/77988 A2 | 10/2001 | ............. G06F 19/00 |

(Continued)

OTHER PUBLICATIONS

Blazina et al., "Patellofemoral replacement: Utilizing a customized femoral groove replacement," 5(1)53-55 (1990).
(Continued)

*Primary Examiner* — Abolfazl Tabatabai
(74) *Attorney, Agent, or Firm* — Sunstein Kann Murphy & Timbers LLP

(57) ABSTRACT

In accordance with the present invention there is provided methods for generating an isotropic or near-isotropic three-dimensional images from two-dimensional images. In accordance with the present invention the method includes, obtaining a first image of a body part in a first plane, wherein the first image generates a first image data volume; obtaining a second image of the body part in a second plane, wherein the second image generates a second image data volume; and combining the first and second image data volumes to form a resultant image data volume, wherein the resultant image data volume is isotropic or near-isotropic.

12 Claims, 6 Drawing Sheets

Related U.S. Application Data continuation of application No. 12/614,946, filed on Nov. 9, 2009, now Pat. No. 8,094,900, which is a continuation of application No. 10/728,731, filed on Dec. 4, 2003, now Pat. No. 7,634,119.

(60) Provisional application No. 60/431,176, filed on Dec. 4, 2002.

(51) Int. Cl.
*G01R 33/56* (2006.01)
*A61B 5/05* (2006.01)
*A61F 2/30* (2006.01)

(58) Field of Classification Search
USPC ........ 382/128–134; 600/9, 10, 407, 41, 411, 600/425, 427, 524, 410; 378/4, 21–27, 378/62; 324/307, 309; 424/9.3; 623/18.11
See application file for complete search history.

(56) References Cited

U.S. PATENT DOCUMENTS

| | | | | |
|---|---|---|---|---|
| 5,423,828 | A | 6/1995 | Benson | 606/102 |
| 5,671,741 | A | 9/1997 | Lang et al. | 128/653.2 |
| 5,737,506 | A * | 4/1998 | McKenna | G06T 17/00 345/427 |
| 5,759,205 | A | 6/1998 | Valentini | 623/16 |
| 6,013,103 | A | 1/2000 | Kaufman et al. | 623/20 |
| 6,081,577 | A | 6/2000 | Webber | 378/23 |
| 6,112,109 | A | 8/2000 | D'Urso | 600/407 |
| 6,151,521 | A * | 11/2000 | Guo | A61B 5/0002 128/904 |
| 6,175,655 | B1 | 1/2001 | George, III et al. | 382/257 |
| 6,219,571 | B1 | 4/2001 | Hargreaves et al. | 600/410 |
| 6,322,588 | B1 | 11/2001 | Ogle et al. | 623/1.46 |
| 6,479,996 | B1 | 11/2002 | Hoogeveen et al. | 324/309 |
| 6,510,334 | B1 | 1/2003 | Schuster et al. | 600/407 |
| 6,514,514 | B1 | 2/2003 | Atkinson et al. | 424/423 |
| 6,556,855 | B2 | 4/2003 | Thesen | 600/419 |
| 6,690,816 | B2 | 2/2004 | Aylward et al. | 382/128 |
| 6,702,821 | B2 | 3/2004 | Bonutti | 606/88 |
| 6,712,856 | B1 | 3/2004 | Carignan et al. | 623/20.35 |
| 6,893,463 | B2 | 5/2005 | Fell et al. | 623/14.12 |
| 6,905,514 | B2 * | 6/2005 | Carignan | A61F 2/30942 623/20.35 |
| 6,984,981 | B2 | 1/2006 | Tamez-Peña et al. | 324/309 |
| 6,998,841 | B1 | 2/2006 | Tamez-Peña et al. | 324/302 |
| 7,117,027 | B2 | 10/2006 | Zheng et al. | 600/426 |
| 7,174,282 | B2 | 2/2007 | Hollister et al. | 703/2 |
| 7,239,908 | B1 | 7/2007 | Alexander et al. | 600/427 |
| 7,438,685 | B2 | 10/2008 | Burdette et al. | 600/439 |
| 7,634,119 | B2 * | 12/2009 | Tsougarakis | G01R 33/56 382/128 |
| 7,796,791 | B2 | 9/2010 | Tsougarakis et al. | |
| 8,077,950 | B2 | 12/2011 | Tsougarakis et al. | |
| 8,094,900 | B2 | 1/2012 | Steines et al. | |
| 8,337,501 | B2 * | 12/2012 | Fitz | A61B 5/4528 606/86 R |
| 8,337,507 | B2 | 12/2012 | Lang et al. | 606/102 |
| 8,343,218 | B2 | 1/2013 | Lang et al. | 623/16.11 |
| 8,551,169 | B2 | 10/2013 | Fitz et al. | 623/14.12 |
| 8,634,617 | B2 | 1/2014 | Tsougarakis et al. | |
| 8,638,998 | B2 * | 1/2014 | Steines | G01R 33/56 382/128 |
| 8,838,998 | B2 * | 9/2014 | Dellow | G06F 21/73 709/220 |
| 8,965,088 | B2 | 2/2015 | Tsougarakis et al. | 382/128 |
| 9,020,788 | B2 * | 4/2015 | Lang | A61F 2/30942 703/6 |
| 2002/0059049 | A1 | 5/2002 | Bradbury et al. | 703/11 |
| 2002/0087274 | A1 | 7/2002 | Alexander et al. | 702/19 |
| 2003/0035773 | A1 | 2/2003 | Totterman et al. | 424/9.1 |
| 2004/0102866 | A1 | 5/2004 | Harris et al. | 623/20.35 |
| 2004/0153079 | A1 | 8/2004 | Tsougarakis et al. | 606/77 |
| 2004/0204644 | A1 | 10/2004 | Tsougarakis et al. | 600/410 |
| 2008/0255445 | A1 | 10/2008 | Neubauer et al. | 600/416 |
| 2010/0054572 | A1 | 3/2010 | Tsougarakis et al. | 382/131 |
| 2010/0303317 | A1 | 12/2010 | Tsougarakis et al. | 382/128 |
| 2012/0093277 | A1 | 4/2012 | Tsougarakis et al. | 382/128 |
| 2012/0201440 | A1 | 8/2012 | Steines et al. | 382/131 |
| 2013/0211531 | A1 | 8/2013 | Steines et al. | 623/20.35 |
| 2014/0153798 | A1 | 6/2014 | Tsougarakis et al. | 382/128 |

FOREIGN PATENT DOCUMENTS

| | | | | |
|---|---|---|---|---|
| WO | WO 02/22014 | 3/2002 | | A61B 5/55 |
| WO | WO 02/061688 | 8/2002 | | G06T 17/00 |
| WO | WO 2004/051301 | 6/2004 | | G01R 33/56 |
| WO | WO 2013/020026 | 2/2013 | | A61F 2/30 |

OTHER PUBLICATIONS

Brown, Ph.D., et al., "MRI Basic Principles and Applications", Second Ed., Mark A. Brown and Richard C. Semelka, 1999, Wiley-Liss Inc., Title page and Table of Contents Pages Only (ISBN 0471330620).

Cohen et al., "Computer-Aided Planning of Patellofemoral Joint OA Surgery: Developing Physical Models from Patient MRI", MICCAI, Oct. 11-13, 1998, 13 pages.

Cohen et al., "Knee cartilage topography, thickness, and contact areas from MRI: in-vitro calibration and in-vivo measurements," Osteoarthritis and Cartilage 7: 95-109 (1999).

Moor et al., "Derivation of Final Implant Volume for Breast Reconstruction Using Three Dimensional CT Scan", Eur. J. Plast. Surg., vol. 23, pp. 138-141, 2000.

Tamez-Pena et al., MRI Isotropic Resolution Reconstruction from two Orthogonal Scans:, Proceedings of the SPIE—The International Society for Optical Engineering SOIE-OMT. vol. 4322, pp. 87-97, 2001.

International Searching Authority, International Search Report—International Application No. PCT/US03/38682, dated Oct. 21, 2004, 3 pages.

International Searching Authority, International Search Report—International Application No. PCT/US2012/049472 dated Oct. 16, 2012, together with the Written Opinion of the International Searching Authority, 12 pages.

Sunstein Kann Murphy & Timbers LLP, Amendment dated Oct. 7, 2008, pertaining to U.S. Appl. No. 10/728,731, 25 pages.

United States Patent and Trademark Office, Notice of Allowance dated May 17, 2010, pertaining to U.S. Appl. No. 10/704,325, 20 pages.

United States Patent and Trademark Office, Notice of Allowance dated Sep. 14, 2011, pertaining to U.S. Appl. No. 12/853,599, 9 pages.

United States Patent and Trademark Office, Notice of Allowance dated Sep. 21, 2009, pertaining to U.S. Appl. No. 10/728,731, 11 pages.

United States Patent and Trademark Office, Office Action dated Apr. 10, 2008, pertaining to U.S. Appl. No. 10/728,731, 17 pages.

United States Patent and Trademark Office, Office Action dated Aug. 4, 2009, pertaining to U.S. Appl. No. 10/704,325, 11 pages.

United States Patent and Trademark Office, Office Action dated Dec. 6, 2010, pertaining to U.S. Appl. No. 12/853,599, 11 pages.

United States Patent and Trademark Office, Office Action dated Jan. 22, 2009, pertaining to U.S. Appl. No. 10/728,731, 6 pages.

Sunstein Kann Murphy & Timbers LLP, Response to Office Action dated Aug. 4, 2009, pertaining to U.S. Appl. No. 10/704,325, 15 pages.

Sunstein Kann Murphy & Timbers LLP, Response to Office Action dated Dec. 6, 2010, pertaining to U.S. Appl. No. 12/853,599, 16 pages.

Sunstein Kann Murphy & Timbers LLP, Response to Office Action dated Jan. 22, 2009, pertaining to U.S. Appl. No. 10/728,731, 25 pages.

(56) References Cited

OTHER PUBLICATIONS

United States Patent and Trademark Office, Office Action dated Feb. 3, 2011, pertaining to U.S. Appl. No. 12/614,946, 15 pages.
Sunstein Kann Murphy & Timbers LLP, Response to Office Action dated Feb. 3, 2011, pertaining to U.S. Appl. No. 12/614,946, 25 pages.
United States Patent and Trademark Office, Notice of Allowance dated Sep. 29, 2011, pertaining to U.S. Appl. No. 12/614,946, 28 pages.
United States Patent and Trademark Office, Office Action dated Nov. 7, 2012, pertaining to U.S. Appl. No. 13/345,843, 18 pages.
Sunstein Kann Murphy & Timbers LLP, Amendment dated May 7, 2013 pertaining to U.S. Appl. No. 13/345,843, 31 pages.
United States Patent and Trademark Office, Notice of Allowance dated May 30, 2013, pertaining to U.S. Appl. No. 13/345,843, 36 pages.
United States Patent and Trademark Office, Office Action dated Oct. 11, 2012, pertaining to U.S. Appl. No. 13/312,339, 32 pages.
Sunstein Kann Murphy & Timbers LLP, Amendment dated Apr. 11, 2013, pertaining to U.S. Appl. No. 13/312,339, 11 pages.
United States Patent and Trademark Office, Notice of Allowance dated May 31, 2013, pertaining to U.S. Appl. No. 13/312,339, 53 pages.
United States Patent and Trademark Office, Office Action dated Mar. 6, 2014, pertaining to U.S. Appl. No. 14/157,707, 25 pages.
U.S. Appl. No. 13/397,457, filed Feb. 15, 2012.
Brett et al., "Quantitative Analysis of Biomedical Images," Univ. of Manchester Zeneca Pharmaceuticals IBM UK, http://www.wiau.man.ac.uk/~ads/imv, 12 pages, 1998.

Falcão et al., "User-Steered Image Segmentation Paradigms: Live Wire and Live Lane," Graphical Models and Image Processing, vol. 60, pp. 233-260, 1998.
Li et al., "A Boundary Optimization Algorithm for Delineating Brain Objects from CT-Scans," Nuclear Science Symposium and Medical Imaging Conference IEEE Conference Record San Francisco CA, 1993.
Lorensen et al., "Marching Cubes: A High Resolution 3D Surface Construction Algorithm," Computer Graphics, vol. 21, No. 4, pp. 163-169, Jul. 1987.
Nishii et al., "Three-Dimensional Evaluation of the Acetabular and Femoral Articular Cartilage in the Osteoarthritis of the Hip Joint. MR Imaging in Two Directional Planes," Seventh Scientific Meeting of ISMRM, p. 1030, 1999.
Piplani et al., "Articular Cartilage Volume in the Knee: Semiautomated Determination from Three-dimensional Reformations of MR Images," Radiology, vol. 198, pp. 855-859, Mar. 1996.
Taha et al., "Modeling and Design of a Custom Made Cranium Implant for Large Skull Reconstruction Before a Tumor Removal," Phidias Newsletter, No. 6, Retrieved from the Internet: URL:http://www.materialise.com/medical/files/pdf, pp. 3-6, Jun. 2001.
Testi et al., "Border-Tracing Algorithm Implementation for the Femoral Geometry Reconstruction," Computer Methods and Programs in Biomedicine, vol. 65, pp. 175-182, 2001.
Warfield et al., "Automatic Segmentation of MRI of the Knee," ISMRM Sixth Scientific Meeting and Exhibition Sydney Australia, p. 563, Apr. 18-24, 1998.
European Patent Office, European Search Report—European Application No. 12000991.5-1654 dated May 23, 2014, 6 pages.
U.S. Appl. No. 13/565,840, filed Aug. 3, 2012.

* cited by examiner

FUSION OF MULTIPLE IMAGING PLANES FOR ISOTROPIC IMAGING IN MRI AND QUANTITATIVE IMAGE ANALYSIS USING ISOTROPIC OR NEAR-ISOTROPIC IMAGING

CROSS-REFERENCE TO RELATED APPLICATIONS

This application is a continuation of U.S. patent application Ser. No. 13/345,843, filed Jan. 9, 2012, entitled "Fusion of Multiple Imaging Planes for Isotropic Imaging in MRI and Quantitative Image Analysis using Isotropic or Near-isotropic Imaging," which in turn is a continuation of U.S. patent application Ser. No. 12/614,946, filed Nov. 9, 2009, entitled "Fusion of Multiple Imaging Planes for Isotropic Imaging in MRI and Quantitative Image Analysis using Isotropic or Near-isotropic Imaging," which in turn is a continuation of U.S. patent application Ser. No. 10/728,731, filed Dec. 4, 2003, entitled "Fusion of Multiple Imaging Planes for Isotropic Imaging in MRI and Quantitative Image Analysis using Isotropic or Near-isotropic Imaging," which in turn claims priority from U.S. Provisional Patent Application Ser. No. 60/431,176, filed Dec. 4, 2002. Each of the above-described applications is hereby incorporated herein by reference, in their entirety.

STATEMENT AS TO RIGHTS TO INVENTIONS MADE UNDER FEDERALLY SPONSORED RESEARCH AND DEVELOPMENT

Certain aspects of the invention described below were made with United States Government support under Advanced Technology Program 70NANBOH3016 awarded by the National Institute of Standards and Technology (NIST). The United States Government may have rights in certain of these inventions.

TECHNICAL FIELD

This invention relates generally to medical imaging, and more specifically to medical imaging that facilitates analysis in more than one dimension, e.g. magnetic resonance imaging (MRI). More particularly the invention relates to isotropic imaging techniques used in medical imaging, such as MRI, to improve quantitative image analysis.

BACKGROUND OF THE INVENTION

Magnetic resonance imaging (MRI) is a noninvasive imaging technique that provides clinicians and diagnosticians with information about the anatomical structure and condition of a region of interest within a subject. See, for example, U.S. Pat. No. 5,671,741 to Lang et al. issued Sep. 30, 1997 for "Magnetic Resonance Imaging Technique for Tissue Characterization;" U.S. Pat. No. 6,219,571 B1 to Hargreaves et al. issued Apr. 17, 2002, for "Magnetic Resonance Imaging Using Driven Equilibrium Fourier Transform;" U.S. Pat. No. 6,479,996 to Hoogeveen et al. issued Nov. 12, 2002 for "Magnetic Resonance Imaging of Several Volumes;" U.S. patent application Ser. No. 2002/0,087,274 A1 to Alexander et al. published Jul. 4, 2002 for "Assessing the Condition of a Joint and Preventing Damage." Commonly, in MRI, a substantially uniform temporally constant main magnetic field ($B_0$) is set up in an examination region in which a subject being imaged or examined is placed. Via radio frequency (RF) magnetic field ($B_1$) excitation and manipulations, selected magnetic dipoles in the subject that are otherwise aligned with the main magnetic field are tipped to excite magnetic resonance. The resonance is typically manipulated to induce detectable magnetic resonance echoes from a selected region of the subject. In imaging, the echoes are spatially encoded via magnetic gradients set up in the main magnetic field. The raw data from the MRI scanner is collected into a matrix, commonly known as k-space. By employing inverse Fourier, two-dimensional Fourier, three-dimensional Fourier, or other known transformations, an image representation of the subject is reconstructed from the k-space data.

Conventional MRI scans produce a data volume, wherein the data volume is comprised of voxels having three-dimensional characteristics. The voxel dimensions are determined by the physical characteristics of the MRI machine as well as user settings. Thus, the image resolution of each voxel will be limited in at least one dimension, wherein the loss of resolution in at least one dimension may lead to three-dimensional imaging problems.

There are many applications in which depth or three-dimensional ("3D") information is useful for diagnosis and formulation of treatment strategies. For example, in imaging blood vessels, cross-sections merely show slices through vessels, making it difficult to diagnose stenosis or other abnormalities. Likewise, interventional imaging, such as needle tracking, catheter tracking, and the like, requires 3D information. Also, depth information is useful in the so-called interactive imaging techniques in which images are displayed in real or near-real time and in response to which the operator can adjust scanning parameters, such as view angle, contrast parameters, field of view, position, flip angle, repetition time, and resolution.

Three-dimensional imaging generally involves either acquiring multiple two-dimensional or slice images that are combined to produce a volumetric image or, alternately, the use of three-dimensional imaging techniques. Much effort at improving the efficiency of volume imaging has been focused on speeding up the acquisition. For example, many two-dimensional fast scan procedures have been adapted to three-dimensional imaging. Likewise, efforts have been made to improve reconstruction speed and efficiency, for example, through the use of improved reconstruction algorithms. Nevertheless, three-dimensional imaging remains relatively slow.

However, current MRI acquisition techniques do not provide high resolution in all planes and quantitative image analysis using isotropic or near-isotropic imaging. Accordingly, the present invention contemplates new and improved magnetic resonance imaging techniques.

An additional problem not addressed by current 3D MRI scanning methods is the reduction of partial volume effects. Partial volume effects are caused when a voxel falls within the boundary between two scanned objects. For example, if a patient's knee is being sagittally scanned, a voxel may be orientated such that part of the voxel falls within the femur and part falls within a space outside of the femur. MR imaging will average the overall gray value over the entire voxel. The lower the scanning resolution the greater the partial volume effects. In a 3D scan, where there is low resolution in at least one plane of the scan impact of the partial volume effects is greatly increased. Thus, there is a need for methods of forming 3D MRI scans with reduced impact of partial volume effects.

Still further, an additional shortcoming of conventional 3D MRI scanning procedures is that boundaries of scanned objects may be missed due to scanning resolution and scan orientation. This may occur when a boundary of an object being scanned lies between the slice thickness of the scan or the boundary of an object is parallel to the imaging plane. Therefore there is a need for improved methods for reducing the likelihood of missed boundaries.

SUMMARY OF THE INVENTION

The invention addresses the problem that with current 3D image acquisition techniques the in-plane (x-y plane) resolution of the slices is usually at least 3 times higher than the slice thickness (in z-dimension). The low resolution between the slices (typically in z-direction) leads to limitations with respect to 3D image analysis and visualization. The structure of 3-dimensional objects cannot be described with the same accuracy in all three dimensions. Partial volume effects affect interpretation and measurements in the z-dimension to a greater extent than in the x-y plane. Thus, resolution and accuracy of multiplanar reformations depend on the slicing direction through the volumetric data.

In addition, the invention also addresses the issue of increasing accuracy of tissue segmentation and/or quantitative analysis of images, such as MR images. For example, after obtaining an isotropic or near-isotropic three-dimensional MR image (e.g., using pulse sequence acquisition techniques described herein and known in the field), particular tissues can be extracted from the image with greater accuracy and, moreover are quantitative. Currently available subjective visual inspection techniques are not quantitative and, additionally, are often inaccurate.

Thus, in one aspect, a method of improving resolution of images, such as MR images, is provided. In certain embodiments, the method includes, for example, obtaining at least two MR scans (e.g., scans in perpendicular planes) of a body part and merging the scans, thereby increasing resolution. In any of the methods described herein, the scans may be in any plane, for example, sagittal, coronal and/or axial imaging planes. Preferably, the second or subsequent scans contain a sufficient number of slices to cover the entire field of view of the first scan. Furthermore, in any of the methods described herein, the data obtained from the two or more scans are subsequently merged to form a new data volume, which is isotropic (or near-isotropic) and has a resolution corresponding to the in-plane resolution of S1 and S2. Merging may include, for example, determining a gray value for each voxel (V) of the new (merged) data volume. In certain embodiments, the gray values are obtained by: (a) determining the position in 3D space for V; (b) obtaining (e.g., from the original scans) gray values of the scans prior to fusion at this position; (c) interpolating (combining) gray values from S1 and S2 into a single gray value (G); and (d) assigning G to V.

In any of the methods described herein, any living tissue can be imaged, including, but not limited to, joints, bones and/or organs (e.g., brain, liver, kidney, heart, blood vessels, GI tract, etc.).

In accordance with the present invention there is provided a MRI scanning method, the method comprising, performing a first MRI scan of a body part in a first plane, wherein the first MRI scan generates a first image data volume; performing a second MRI scan of the body part in a second plane, wherein the second MRI scan generates a second image data volume; and combining the first and second image data volumes to form a resultant image data volume, wherein the resultant image data volume is isotropic.

In accordance with another embodiment of the present invention there is provided a method for producing isotropic or near-isotropic image data, the method comprising: obtaining a first image data volume from a first MRI scan in a first plane; obtaining a second image data volume from a second MRI scan in a second plane; extracting boundary image data from each of the first and second image data volumes; combining said extracted boundary image data to form a resultant image data volume.

In accordance with the present invention there is provided a method for generating a three dimensional data volume, the method comprising: acquiring at least two data volumes from at least two MRI scans performed in two different planes; combining the data volumes to form a resultant data volume; selecting a therapy in response to the resultant data volume; and deriving a shape for an implant.

The system includes an image analysis method. The image analysis is performed by obtaining a first image of a body part in a first plane, wherein the first image generates a first image data volume; obtaining a second image of the body part in a second plane, wherein the second image generates a second image data volume; and combining the first and second image data volumes to form a resultant image data volume, wherein the resultant image data volume is isotropic. Additionally, first and second gray values can be obtained from the first and second image data volumes at one or more three-dimensional positions. That data can then be interpolated to provide a resultant gray value which is then assigned to a voxel in the three-dimensional position of the resultant data volume. As will be appreciated by those of skill in the art, the angle between the images can range from about 0° to 180°, or from 0° to 90°. Once these values have been obtained, a therapy or treatment can be selected to complement the data volume. A person of skill in the art will appreciate that at least one additional image of a body part taken in a plane different than any previous plane used can be taken used to generate additional image volume. From that image volume, data volume is generated which can then be combined with the first and second image data volumes to form a resultant data volume. Of course, extracting a boundary image data volume from the resulting image data volume can also be performed, if desired.

A method is also described for producing isotropic or near-siotropic image data from images. This method generally comprises: obtaining a first image data volume from a first image in a first plane; obtaining a second image data volume from a second image in a second plane; extracting boundary image data from each of the first and second image data volumes; and combining the extracted boundary image data to form a resultant image data volume. Of course, it is possible to also obtaining at least one additional image data volume from at least one additional image in a plane different than the first plane and the second plane; extracting an additional boundary image data from the additional image data volume; and combining the additional boundary image data volume with the resultant image data volume. This resultant data can be isotropic or near-isotropic. As will be appreciated, the first plane can be at an angle relative to the second plane; that angle can be from about 0° to 180° or from about 0° to 90°.

A method is included for generating a three dimensional data volume. Generally, this method includes acquiring at least two data volumes from at least two images performed in two different planes; combining the data volumes to form a resultant data volume; selecting a therapy in response to the resultant data volume; selecting an implant; and deriving a shape for an implant. The combining step can further include obtaining gray values for each data point in each of the data volumes; interpolating a resultant gray value from gray values; and assigning the resultant value to each data point of the resultant data volume. Prior to combining the data, data corresponding to any surface can be scanned in each plane and extracted.

Another method for generating three dimensional data is also disclosed. This method includes obtaining a first image in a first plane producing a first data volume with a default resolution; obtaining a second image in a second plane producing a second data volume with the default resolution; combining the first and second data volumes to produce a resultant data volume, the resultant data volume having a resultant resolution. As will be appreciated, the resultant resolution is greater than the default resolution.

An image analysis method is disclosed that includes the steps of obtaining at least one image of a body part in at least a first plane and a second plane, wherein the first plane generates a first image data volume and the second plane generates a second image data volume; and combining the first and second image data volumes to form a resultant image data volume, wherein the resultant image data volume is isotropic.

An alternative image analysis method is also disclosed that includes obtaining at least one image of a body part in at least a first plane and a second plane, wherein the first plane generates a first image data volume and the second plane generates a second image data volume; and combining the first and second image data volumes to form a resultant image data volume, wherein the resultant image data volume is near-isotropic.

In accordance with the present invention there is provided a method for generating three dimensional MRI scan data, the method comprising: performing a first MRI scan in a first plane producing a first data volume with a default resolution; performing a second MRI scan in a second plane producing a second data volume with the default resolution; combining the first and second data volumes to produce a resultant data volume, the resultant data volume having a resultant resolution.

DETAILED DESCRIPTION OF SPECIFIC EMBODIMENTS

Figure 1:
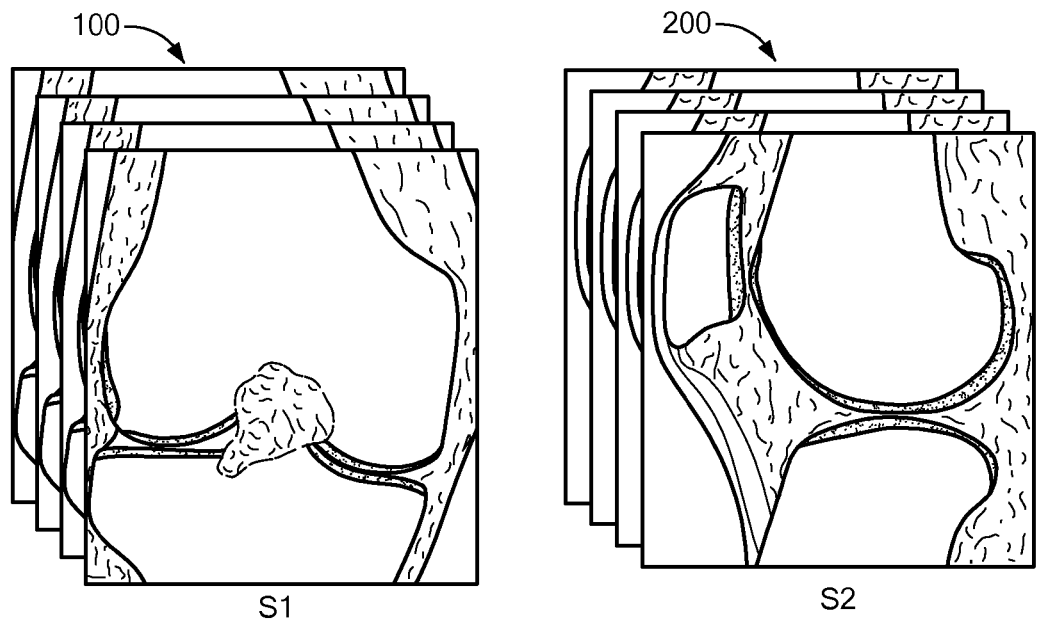
FIG. 1 illustrates two MRI scans illustrating data volumes S1 and S2; each of the scans shows a plurality of image slides taken in planes parallel to the initial scan.

The following description is presented to enable any person skilled in the art to make and use the invention. Various modifications to the embodiments described will be readily apparent to those skilled in the art, and the generic principles defined herein can be applied to other embodiments and applications without departing from the spirit and scope of the present invention as defined by the appended claims. Thus, the present invention is not intended to be limited to the embodiments shown, but is to be accorded the widest scope consistent with the principles and features disclosed herein. To the extent necessary to achieve a complete understanding of the invention disclosed, the specification and drawings of all issued patents, patent publications, and patent applications cited in this application are incorporated herein by reference.

As will be appreciated by those of skill in the art, methods recited herein may be carried out in any order of the recited events which is logically possible, as well as the recited order of events. Furthermore, where a range of values is provided, it is understood that every intervening value, between the upper and lower limit of that range and any other stated or intervening value in that stated range is encompassed within the invention. Also, it is contemplated that any optional feature of the inventive variations described may be set forth and claimed independently, or in combination with any one or more of the features described herein.

The present invention is of a method of image analysis that can be used for improving tissue segmentation and/or quantifying image analysis. Specifically, the present invention combines two or more images to achieve high resolution in all three-dimensional directions. The principles and operation of the method according to the present invention may be better understood with reference to the accompanying descriptions.

1.0 General Overview

According to the present invention, a method of improving resolution and/or tissue segmentation of images taken of a body part is described. This method typically involves acquiring at least two images in different planes and combining the images to achieve the same (e.g., high) degree of resolution in all directions. The images can be acquired, for example, by using an MRI. However, as other imaging devices become available, those of skill in the art will appreciate that these techniques can be provided to other imaging devices as well, without departing from the scope of the invention.

The methods described herein provide isotropic or near-isotropic resolution which results in improved tissue segmentation. Unlike currently employed visual inspection, which is highly subjective, the methods and compositions described herein are quantitative and, accordingly, increase the accuracy of diagnosis and design of treatment regimes.

1.1 Magnetic Resonance Imaging (MRI)

Describing MRI in general terms, all protons within living tissues have an inherent magnetic moment and spin randomly giving rise to no net magnetization or direction. When a specimen is placed within the magnetic field of the MR scanner, the protons continue to spin but align themselves parallel or anti-parallel to the direction of the field ($B_0$) corresponding to low and high-energy states respectively. In the course of an MR examination, a radiofrequency (RF) pulse ($B_1$) is applied to the sample from a transmitter coil orientated perpendicular to $B_0$ and the protons are momentarily tilted out of alignment; the precession of the induced net transverse magnetization around the axis of the static $B_0$ field produces a voltage across the ends of the receiver coil which is detected as the MR signal. For a general discussion of the basic MRI principles and techniques, see MRI Basic Principles and Applications, Second Edition, Mark A. Brown and Richard C. Semelka, Wiley-Liss, Inc. (1999); see, also, U.S. Pat. No. 6,219,571 to Hargreaves, et al.

1.1 High Resolution 3D MRI Pulse Sequences

MRI employs pulse sequences that allow for better contrast of different parts of the area being imaged. Different pulse sequences are better suited for visualization of different anatomic areas. More than one pulse sequence can be employed at the same time. A brief discussion of different types of pulse sequences is provided in International Patent Publication WO 02/22014 to Alexander et al. published Mar. 21, 2002.

Routine MRI pulse sequences are available for imaging tissue, such as cartilage, include conventional T1 and T2-weighted spin-echo imaging, gradient recalled echo (GRE) imaging, magnetization transfer contrast (MTC) imaging, fast spin-echo (FSE) imaging, contrast enhanced imaging, rapid acquisition relaxation enhancement, (RARE) imaging, gradient echo acquisition in the steady state, (GRASS), and driven equilibrium Fourier transform (DEFT) imaging. As these imaging techniques are well known to one of skill in the art, e.g. someone having an advanced degree in imaging technology, each is discussed only generally hereinafter.

1.2. Measurement of T1 and T2 Relaxation

As a result of random thermal motion, the proton spins within a sample lose coherence with one another. This loss of coherence results in signal decay. The time taken for the MR signal to return to zero depends on many factors, one is the rate at which the energized spins lose excess energy relative to their immediate environment. This phenomenon called spin-lattice, or T1 relaxation, affects mainly magnetization parallel to $B_0$ and leads to a net loss of energy from the spin system.

Another phenomenon that is observed is that the spins of neighboring protons tend to drift out of alignment with one another as a result of slight differences in frequency. This causes a loss in phase coherence, referred to as spin-spin or $T_2$ relaxation. $T_2$ relaxation affects the transverse component of the magnetization but does not cause a net loss of energy.

Conventional T1 and T2-weighted MRI depict living tissue such as articular cartilage, and can demonstrate defects and gross morphologic changes. One of skill in the art could readily select a T1 or T2-weighted MRI depending on the structure to be imaged. For example, T1-weighted images show excellent intra-substance anatomic detail of certain tissue such as hyaline cartilage while T2-weighted imaging provides a better depiction of joint effusions and thus surface cartilage abnormalities.

1.3 Gradient-Recalled Echo (GRE) Imaging

Gradient-recalled echo (GRE) imaging has 3D capability and the ability to provide high resolution images with relatively short scan times. Fat suppressed 3D spoiled gradient echo (FS-3D-SPGR) imaging has been shown to be more sensitive than standard MR imaging for the detection of hyaline cartilage defects such as those typically occurring in the knee.

1.4 Magnetization Transfer Contrast Imaging

Magnetization transfer imaging can be used to separate articular cartilage from adjacent joint fluid and inflamed synovium.

1.5 Fast Spin-Echo (FSE) Imaging

Fast spin-echo (FSE) imaging is another useful pulse sequence MRI technique. Incidental magnetization transfer contrast contributes to the signal characteristics of on fast spin-echo images and can enhance the contrast between tissues. Sensitivity and specificity of fast spin-echo imaging have been reported to be 87% and 94% in a study with arthroscopic correlation.

1.6 Echo Planar Imaging (EPI)

Echo planar imaging (EPI) is an imaging technique in which a series of echoes is rapidly induced following a single radiofrequency (RF) pulse. More specifically, an RF pulse and a slice select gradient are applied to excite resonance in a selected slice and a phase encode gradient is applied to phase encode the resonance. A series of frequency encode or read gradients of alternating polarity is applied in successive fashion. During each read gradient, a magnetic resonance signal or echo is read out. Between each read gradient, a short pulse or blip along the phase encode gradient axis is applied to increment the phase encoding of the resonance by a line in the selected slice. A one-dimensional inverse Fourier transform of each echo provides a projection of the spin distribution along the read axis. A second inverse Fourier transform along the phase encoded echoes provides a second dimension of spatial encoding. Typically, the phase encode gradient blips are selected of an appropriate magnitude that data for a complete field of view is taken following each RF pulse. The total sampling time is determined by the number of sampled points per read gradient and the number of phase encode gradient steps.

Echo volume imaging extends echo planar imaging techniques to multiple planes. After performing the above-described echo planar imaging sequence, a pulse or blip along a secondary phase encoding axis is applied. Typically, the secondary phase encoding blips step the phase encoding along an axis perpendicular to the primary phase encode and read axes. Thereafter, phase encode gradient blips are applied between each read gradient to step line by line in the primary phase encode direction. Because the phase encode blips in the first k-space plane move the phase encoding to one extreme edge of the field of view, the phase encoding blips in the second k-space plane in the secondary phase encode direction are typically of the opposite polarity to step the phase encoding back in the opposite direction. In this manner, the multiple planes are aligned, but offset in steps in the z-direction. One disadvantage of the above echo planar imaging and echo volume imaging techniques is that the trajectory through k-space is reversed in time for alternate phase encode lines or views. This causes phase discontinuities that can result in ghosting.

Spiral echo planar imaging techniques are also known, in which the applied x- and y-gradient pulses, i.e., along the traditional read and phase encode axes, are sinusoidally varying and linearly increasing. In this manner, data sampling commences at the center of the field of view and spirals outward, covering the field of view along a spiral k-space trajectory. One of the drawbacks of spiral echo planar imaging, however, is that it is a single slice technique. To obtain multiple slices, the spiral echo planar imaging technique is repeated multiple times. An RF excitation pulse and slice select gradient followed by sinusoidally varying and linearly increasing x and y-gradients are applied for each slice to achieve coverage of the volume of interest.

1.7 Contrast Enhancing Imaging

The use of gadolinium in imaging has been applied in several different forms. For example, direct magnetic resonance (MR) arthrography, wherein a dilute solution containing gadolinium is injected directly into a tissue (e.g., joint), improves contrast between cartilage and the arthrographic fluid. Indirect MR arthrography, with a less invasive intravenous injection, can also been applied. Gadolinium enhanced imaging has the potential to monitor glycosaminoglycan content, which may have implications for longitudinal evaluations of injured soft tissue such as cartilage.

1.8 Driven Equilibrium Fourier Transformation

Another 3D imaging method that has been developed is based on the driven equilibrium Fourier transform (DEFT) pulse sequence (U.S. Pat. No. 5,671,741 to Lang et al. issued Sep. 30, 1997), and may be specifically utilized for soft tissue (e.g., cartilage) imaging. DEFT provides an effective tradeoff between T2/T1 weighting and spin density contrast that delineates the structures of interest. Contrast-to-noise ratio may, in certain tissues/structures, be greater with DEFT than with spoiled gradient echo (SPGR). DEFT is an alternative approach to SPGR. DEFT contrast is very well suited to imaging articular cartilage. Synovial fluid is high in signal intensity, and articular cartilage intermediate in signal intensity. Bone is dark, and lipids are suppressed using a fat saturation pulse.

1.9 A Representative Example of MR Imaging

A MR image can be performed using a whole body magnet operating at a field strength of 1.5 T (GE Sigma, for example, equipped with the GE SR-120 high speed gradients [2.2 Gauss/cm in 184 μsec risetimes]). Prior to MR imaging, external markers filled with Gd-DTPA (Magnevist®, Berlex Inc., Wayne, N.J.) doped water (T1 relaxation time approximately 1.0 sec) can be applied to the skin. External markers can be included in the field of view of all imaging studies. Patients can be placed in the scanner in supine position and the appropriate area imaged. After an axial scout sequence, coronal and sagittal T1-weighted images can be acquired using the body coil (spin-echo, TR=500 msec, TE=15 msec, 1 excitation (NEX), matrix 256>128 elements, field of view (FOV) 48 cm, slice thickness 7 mm, interslice spacing 1 mm). The scanner table can then be moved to obtain coronal and sagittal images using the same sequence parameters. These T1-weighted scans can be employed to identify axes that can be used later for defining the geometry of the tissue. A rapid scout scan can be acquired in the axial plane using a gradient echo sequence (GRASS, 2D Fourier Transform (2DFT), TR=50 msec, TE=10 msec, flip angle 40°, 1 excitation (NEX), matrix 256×128 elements, field of view (FOV) 24 cm, slice thickness 7 mm, interslice spacing 3 mm). This scout scan can be used to determine all subsequent high resolution imaging sequences centered over the body part. Additionally, using the graphic, image based sequence prescription mode provided with the scanner software, the scout scan can help to ensure that all external markers are included in the field of view of the high resolution MR sequences.

There are several issues to consider in obtaining a good image. One issue is good contrast between different tissues in the imaged area in order to facilitate the delineation and segmentation of the data sets. In addition, if there are external markers, these must be visualized. One way to address these issues is to use a three-dimensional spoiled gradient-echo sequence in the sagittal plane with the following parameters (SPGR, 3DFT, fat-saturated, TR=60 msec, TE=5 msec, flip angle 40°, 1 excitation (NEX), matrix 256×160 elements, rectangular FOV 16×12 cm, slice thickness 1.3 mm, 128 slices, acquisition time approximately 15 min). Using these parameters, one can obtain complete coverage across the body area and the external markers both in mediolateral and anteroposterior direction while achieving good spatial resolution and contrast-to-noise ratios. The fat-saturated 3D SPGR sequences can be used for rendering many tissues in three dimensions, e.g. cartilage. The 3D SPGR sequence can then be repeated in the sagittal plane without fat saturation using the identical parameters and slice coordinates used during the previous acquisition with fat saturation. The resultant non-fat-saturated 3D SPGR images demonstrate good contrast between low signal intensity cortical bone and high signal intensity bone marrow thereby facilitating 3D rendering of the femoral and tibial bone contours. It is to be understood that this approach is representative only for joints and should not be viewed as limiting in any way.

1.10 Magnetic Resonance Imaging-Vertocally Open Magnet (0.5 T)

MR imaging can also be performed using a 0.5 T vertically open MR unit (GE Signa SP, General Electric, Milwaukee, Wis.) and a MR tracking system. Prior to MR imaging, external markers filled with Gd-DTPA (Magnevist®, Berlex Inc., Wayne, N.J.) doped water (T1 relaxation time approximately 1.0 sec) can be applied to the skin. The subject can be placed in upright position inside the magnet. The body part can be perpendicular to the main magnetic field. A 2DFT fast spin echo pulse sequence can be acquired in the sagittal plane (FSE, TR=4000 msec, TE=25 msec, bandwidth 7.8 kHz, echo train length 8, 3 excitations, slice thickness 4 mm, interslice spacing 0.5 mm, matrix 256×192 elements, field of view 24 cm). For rapid scan acquisition with scan plane tracking, a fast single slice gradient-echo pulse sequence can be acquired in the sagittal plane or in the axial plane (GRASS, TR=14 msec, TE=5 msec, flip angle 40 degrees, bandwidth 32 kHz, 1 excitation, slice thickness 4 mm, matrix 256×128 elements, field of view 20 cm, temporal resolution 2 sec/image). A field of view of 20 cm can be chosen in order to achieve sufficient anatomic coverage in superoinferior.

2.0 Fusing Images

Despite the existence of these imaging techniques, resolution in more than one plane remains difficult. In accordance with the present invention there is provided methods to overcome resolution difficulties wherein at least two data volumes from two separate images, such as MRI scans, are combined to form a single data volume having isotropic or near-isotropic resolution.

Referring now to FIG. 1, there is shown at least two exemplary data volumes S1 100 and S2 200 generated by at least two separate images. As illustrated here, each data volume 100, 200 has a plurality of data volumes $100_{(1-n)}$, $200_{(1-n)}$, as shown by the stacking of the image slices. S1 is an image of a knee joint taken in the coronal plane, while S2 is an image of a knee joint taken in the sagittal plane. In this example, S1 and S2 are taken in planes that are perpendicular to each other. However, as will be appreciated by those of skill in the art, other orientations and plane relationships can be used without departing from the scope of the invention.

Each data volume can have equal imaging dimensions in two dimensions, for example, the x and y-axes, while the imaging dimension in a third dimension, e.g. z-axis, is greater than those in the first two dimensions, in this case the x-axis and y-axes. In a preferred embodiment a second scan can be taken at an angle between, for example, about 0° and 180° and more preferably between about 0° and 90°

Although the present invention is described using at least two scans, a person of skill in the art will appreciate that more scans can be used without departing from the scope of the invention. Thus, additional scans in the same or other planes or directions can also be obtained and analyzed. For example, if the first scan is acquired in the sagittal direction, a second scan in the coronal or axial imaging plane can then be acquired.

It is possible that the second scan would have the same in-plane resolution as the first scan. The second scan could then contain a sufficient number of slices to cover the entire field of view of the first scan, thereby resulting in two data volumes with information from the same 3D space.

Figure 2:
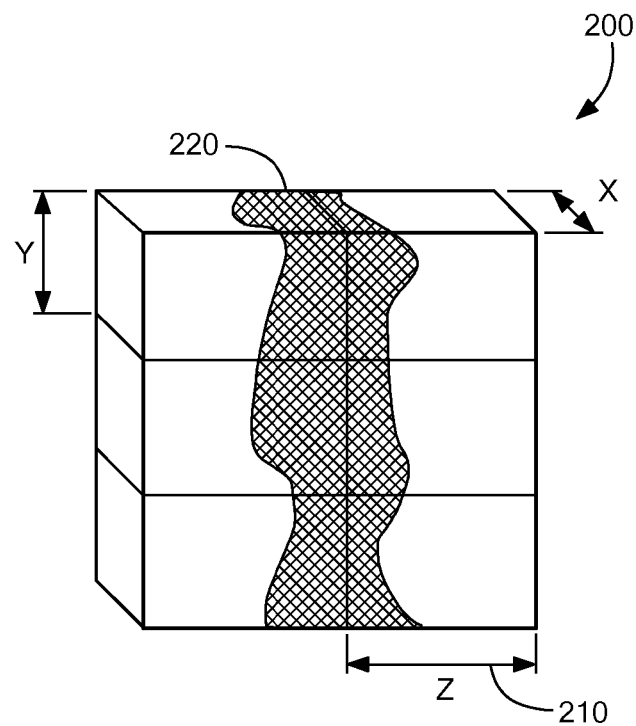
FIG. 2 illustrates a set of three voxels produced by an image scan illustrating an increased z-axis length.

As described above, the data volumes generated from each image include x, y, and z-axis coordinate data, wherein as shown in FIG. 1 the x and y-axis data is isotropic while the z-axis data is non-isotropic. This phenomenon is better shown in FIG. 2 where there is shown an exemplary set of three voxels 200 as produced by an MRI scan in accordance with the present invention. The voxels 200 shown in FIG. 2 are shown being orientated in the z-axis wherein the arrow 210 indicated the slice thickness of the image, in this case an MRI scan. The voxels 200 further include a physical item 220 to be imaged. As shown in FIG. 2 it can be seen that due to the slice thickness 210, information pertaining to the physical item 220 to be imaged results in decreased accuracy.

In addition to potentially missing data another problem with the larger slice thickness is the increase of partial volume effects. A partial volume effect occurs when a voxel only covers part of an object to be imaged, thus the gray value of the voxel is averaged instead of being a true gray value. As shown in FIG. 2, a partial volume effect occurs when a pixel or voxel is partially disposed over an object to be imaged 220. Since the voxel 200 is disposed partially over the object to be imaged the voxel's gray value will be averaged. To reduce the occurrence of partial volume effects, the present invention reduces the slice thickness of the scan, thereby reducing the likelihood of each voxel from being partially disposed on the object to be imaged.

Figure 3:
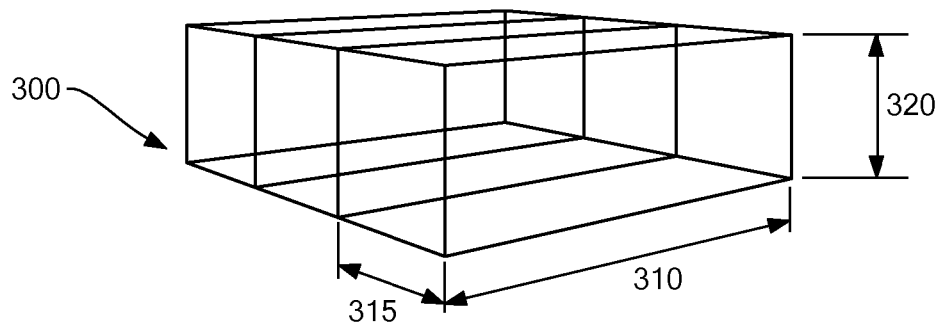
FIG. 3 illustrates a first set of three voxels produced by an image scan illustrating a z-axis component.
Figure 4:
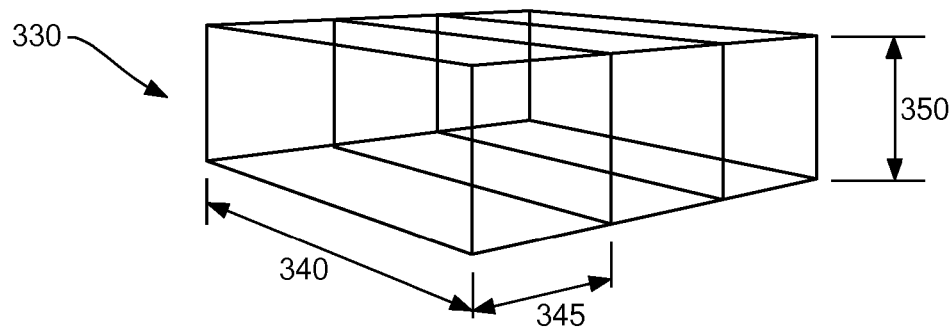
FIG. 4 illustrates a second set of three voxels produced by an image scan illustrating a z-axis component.
Figure 5:
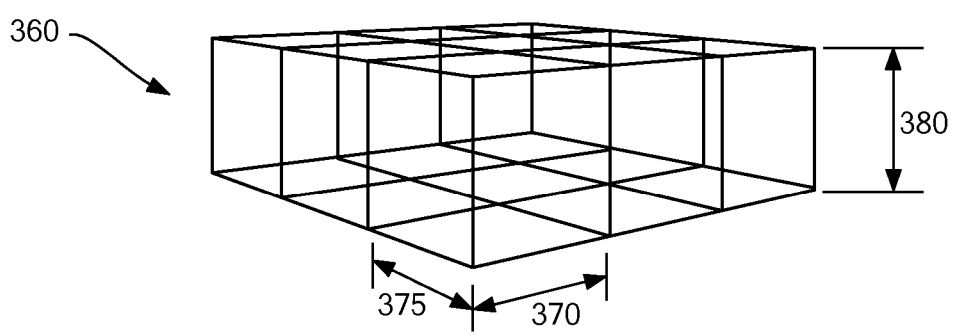
FIG. 5 illustrates a resultant set of nine voxels generated by the methods in accordance with the present invention.

Referring now to FIGS. 3-5, there is shown an exemplary embodiment of producing an isotropic or near-isotropic voxel in accordance with the present invention. As shown in FIG. 3, there is shown a set of three voxels 300 produced by an image scan, wherein the voxels are shown having a z-axis 310 of greater length than the x-axis 315 and y-axis 320.

Referring now to FIG. 4, there is shown a second set of three voxels 330 produced by a second image scan, wherein the second scan was taken at an angle .theta. relative to the first scan. As discussed above, .theta. can range from, for example, about 0° to about 180°. As shown in FIG. 4, the second set of voxels has a z-axis dimension 340 greater than its x-axis 345 and y-axis 350, wherein the z-axis 340 of the second set of voxels can be orientated in a plane different than that of the first set of voxels.

Referring now to FIG. 5, there is shown a third set of voxels 360 consisting of nine voxels, wherein the third set of voxels 360 has been formed by combining the first and second sets of voxels, wherein the z-axis data of the first set has been combined with x-axis or y-axis data from the second set of voxels to form a new z-axis 370 of the third set of voxels 360, wherein the z-axis of the third voxel 370 has a length equal to or nearly equal to that of the x-axis 375 and y-axis 380, therefore producing voxels having isotropic or near-isotropic dimensions.

After having performed at least two scans producing two data volume sets as shown in FIG. 1, the two data volumes are subsequently merged into a third data volume as shown in FIGS. 3-5. This resultant data volume is isotropic or near-isotropic with a resolution corresponding to the in-plane resolution of S1 and S2. The gray value for each voxel of the third data volume is preferably calculated as follows: (a) determine the position in 3D space for each voxel; (b) determine (e.g., look up) the gray values in S1 and S2 at this position; (c) employ an appropriate interpolation scheme to combine the two gray values into a single gray value; and (d) assign each determined gray value to each voxel in the resultant data volume.

These manipulations may be repeated for more scans. Furthermore, to compensate for differences in positioning between S1 and S2 of the scanned subject, e.g. due to motion, a registration technique such as principal-axis or volume-based matching can be applied.

3.0 Tissue Segmentation

In accordance with an alternative embodiment of the present invention there is provided a method of producing isotropic or near-isotropic MRI scan data from at least two image scans.

As described in detail above, two individual data volumes are obtained from two separate image scans, wherein each of the scans have been taken at an angle .theta. relative to each other. In a preferred embodiment, the second scan, or image, is preferably taken at an angle .theta. between about 0° and 180° more preferably between an angle between about 0° and 90°. Wherein each of the image scans produce individual data volumes having x, y, and z components wherein the x and y components are isotropic or nearly isotropic and the z-axis size is determined by the slice thickness (or step length) of, for example, the MRI machine.

Tissue segmentation means can be applied to extract one or more tissues from one or more images. This can be achieved with classification of pixels or voxels of an electronic anatomical image (e.g. x-ray, CT, spiral CT, MRI) into distinct groups, where each group represents a tissue or anatomical structure or combination of tissues or anatomical structures or image background. For example, as described above, every data point of the first and second data volumes were combined to form a resultant data volume. Segmentation can then be performed on the entire data volume or subportions of the data volume. While effective in producing an isotropic or near-isotropic resultant data volume, the amount of data processing is great. Therefore, the method above requires a fairly substantial amount of computer processing power as well as time to complete the mathematical calculations required.

Figure 6:
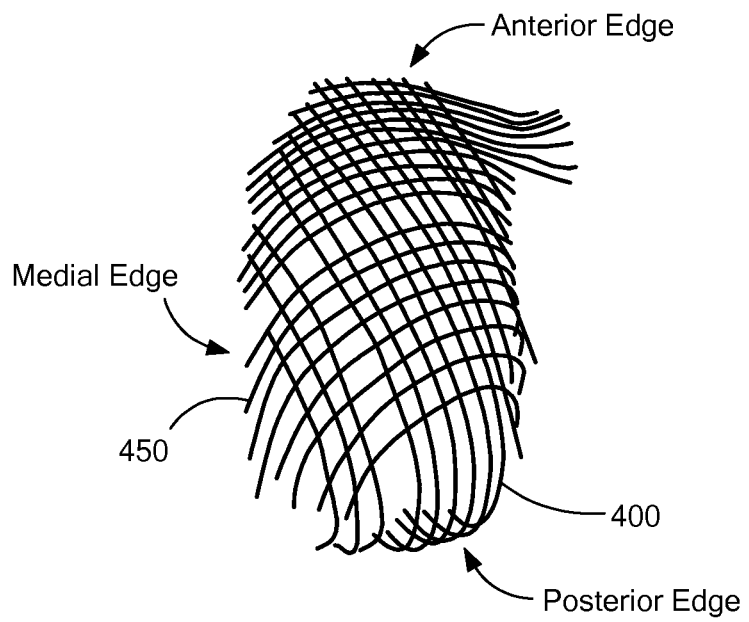
FIG. 6 illustrates a combined boundary image data extracted from two image scans.

Referring now to FIG. 6 there is shown an exemplary embodiment of a three-dimensional MRI scan produced in accordance with the tissue segmentation methods of the present invention, wherein data pertaining to the object to be imaged has been first extracted from each of the data volumes prior to combining the extracted data to produce the three-dimensional scan of FIG. 6. As shown in FIG. 6, the cartilage surface of the medial femoral condyle is shown, wherein a sagittal scan 400 and a coronal scan 450 were both acquired at a resolution of 0.27 mm×0.27 mm in-plane resolution, and a 3 mm slice thickness with a 0.5 mm spacing. As shown in FIG. 6, the medial edge is outlined well in the coronal scan, while the posterior edge of the condyle can be best seen in the sagittal scan.

In accordance with the alternative embodiment, data pertaining to a surface or an area of interest is first extracted from each data volume produced by two or more image scans. After extracting the data volumes of interest, each pixel or voxel in the data volumes are subsequently merged into a new data volume by transforming them into a common coordinate system. This can be achieved by explicitly computing a transformation matrix for one or more of the data sets through the use of anatomical or other user defined landmarks or through a priori knowledge of the image position and orientation, such as the information provided by the DICOM imaging standard. To define a transformation in 3D space, the coordinates of four points in the original data volume and its corresponding location in the new data volume needs to be identified. These coordinate pairs are used to set-up a linear system of the form:

$$A \times T = B,$$

where A is the matrix with the original coordinates, T is the transformation matrix and B is the matrix with the new coordinates. The solution to the above system is given by:

$$T = B \times A^{-1}$$

Alternatively, a transformation matrix can be implicitly calculated by performing a surface registration between the data sets. A surface registration algorithm merges the two data volumes by minimizing a cost function, such as a Euclidean distance transform and thus combining the volume data. FIG. 6 shows an example of a resultant data volume. This resultant data volume is isotropic or near-isotropic with a resolution corresponding to the in-plane resolution of S1 and S2.

In another embodiment of the invention, a 3D MRI image is obtained using any suitable technique, for example using pulse sequence acquisition parameters that provide a 3D rather than a 2D Fourier Transform acquisition with isotropic or near-isotropic resolution, or by using fusion of two or more 2D acquisitions. As used herein, isotropic resolution refers to an MRI image in which the slice thickness is equal to the in-plane resolution. Similarly, the term "near-isotropic resolution" refers to an image in which the slice thickness does not exceed more than 2× the in-plane resolution, more preferably not more than 1.5× the in-plane resolution and even more preferably not more than 1.25× the in-plane resolution. The isotropic or near-isotropic 3DFT imaging pulse sequence has advantages with regard to partial volume averaging. Partial volume averaging is typically not greater in slice direction (z-direction) than in the imaging plane (x and y-direction).

Non-limiting examples of pulse sequences suitable for obtaining near-isotropic or isotropic images include 3D FSE, 3D MFAST/3D SS-SPGR, 3D FIESTA/3D SSFP, 3D FEMR, 3D DESS, 3D VIBE, and 3D SSFP. The preferred in-plane resolution of the 3DFT isotropic or near-isotropic imaging sequence is less than 0.5 mm and the preferred slice thickness is less than 0.8 mm, preferably less than 0.5 mm.

Subsequently, these isotropic or near-isotropic resolution images are used to increase the accuracy of segmentation or tissue extraction and any subsequent visualizations and/or quantitative measurements of the body part, (e.g., measurement of cartilage thickness or size of cartilage defects).

Thus, the invention described herein allows, among other things, for increased resolution and efficiency of tissue segmentation or tissue extraction. Following the manipulations described herein (e.g., merging of multiple images, isotropic or near-isotropic resolution imaging), commercially available segmentation software can be used, for example software that includes seed-growing algorithms and active-contour algorithms that are run on standard personal computers.

For example, articular cartilage shown in the 3D MR images may be analyzed. A sharp interface is present between the high signal intensity bone marrow and the low signal intensity cortical bone thereby facilitating seed growing.

One exemplary, but not limiting, approach uses a 3D surface detection technique that is based on a 2D edge detector (Wang-Binford) that has been extended to 3D. This surface detection technique can generate surface points and their corresponding surface normal. To smooth the contour, the program samples 25 percent of the surface points and fits a cubic spline to the sample points. The program can compute the curvature along sample spline points and find two sample points that have the maximum curvature and are separated by about half the number of voxels on the contour. These points partition the spline into two subcontours. For each subcontour, the program can compute the average distance between the points and the center of the mass.

Programs can allow the user, through the use of the mouse and/or keyboard, the ability to observe the scene from arbitrary angles; to start and stop the animation derived from the 3D data. Additionally, the user can derive quantitative information on the scene through selecting points with the mouse.

The software programs can be written in the C++ computer language and can be compiled to run, for example on Silicon Graphics Workstations or Windows/Intel personal computers.

4.0 Three-Dimensional Images

After the 3D MR image is obtained, by either using a 3D acquisition or by fusing two or more 2D scans as described above, and after one or more anatomical objects have been extracted using segmentation techniques, for example, the object information can be transformed to a surface representation using a computer program. The program can, for example, be developed in AVS Express (Advanced Visual Systems, Inc., Waltham, Mass.). Every voxel has a value of zero if it is not within an object of interest or a value ranging from one to 4095, depending on the signal intensity as recorded by the 1.5 T MR. An isosurface can then be calculated that corresponds to the boundary elements of the volume of interest. A tesselation of this isosurface is calculated, along with the outward pointing normal of each polygon of the tesselation. These polygons can be written to a file in a standard graphics format (e.g. Virtual Reality Modeling Language Version 1.0: VRML output language) and visualized on a computer screen.

Visualization programs are also available, for example, user controllable 3D visual analysis tools. These programs read in a scene, which scene consists of the various 3D geometric representations or "actors." The program allows the user, through the use of the mouse and/or keyboard, the ability to observe the scene from arbitrary angles; to start and stop the animation derived from the 3D data. Additionally, the user may derive quantitative information on the scene through selecting points with the mouse.

The software programs can be written in the C++ computer language and be compiled to run, for example, on Silicon Graphics Workstations and Windows/Intel personal computers. Biochemical constituents, for example of cartilage, may also be visualized, for example as described in WO 02/22014 to Alexander.

Figure 8A:
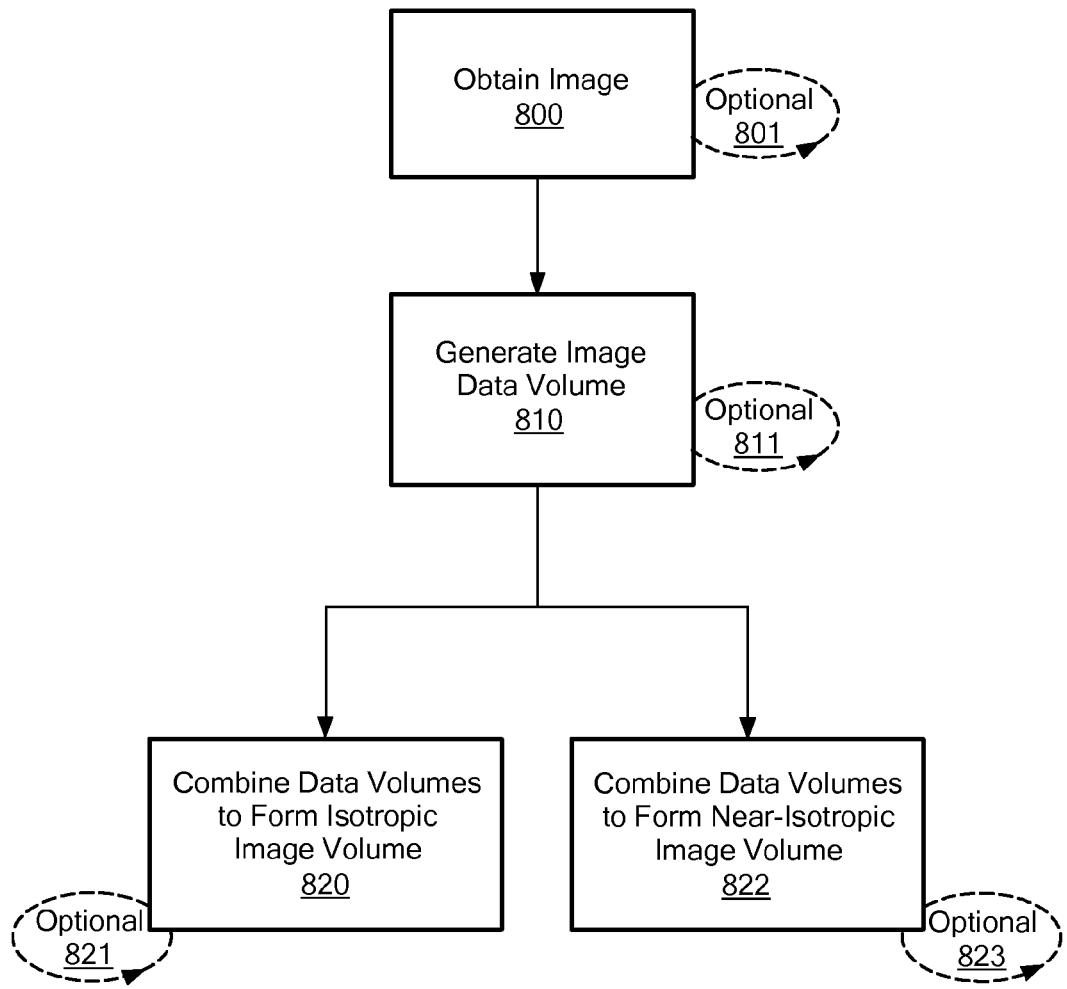
FIGS. 8A-C illustrate flow charts illustrating processes of the invention.

A method is also described for producing isotropic or near-isotropic image data from images. This method is shown in FIG. 8A. The first step is to obtain an image 800. As shown by optional repeat step 801, this step can be repeated such that multiple images are obtained. Suitable images include, for example, MRI. Once the image or images have been obtained image data volume is obtained 810. Image data volume can be obtained one or more times as indicated by the optional repeat step 811. The generated image data is then combined to form an isotropic image volume 820 or a near-isotropic image volume 822. As will be appreciated by those of skill in the art, the process of forming one or more isotropic or near-isotropic image volume can be repeated one or more times as shown by optional repeat steps 821, 823.

Figure 8B:
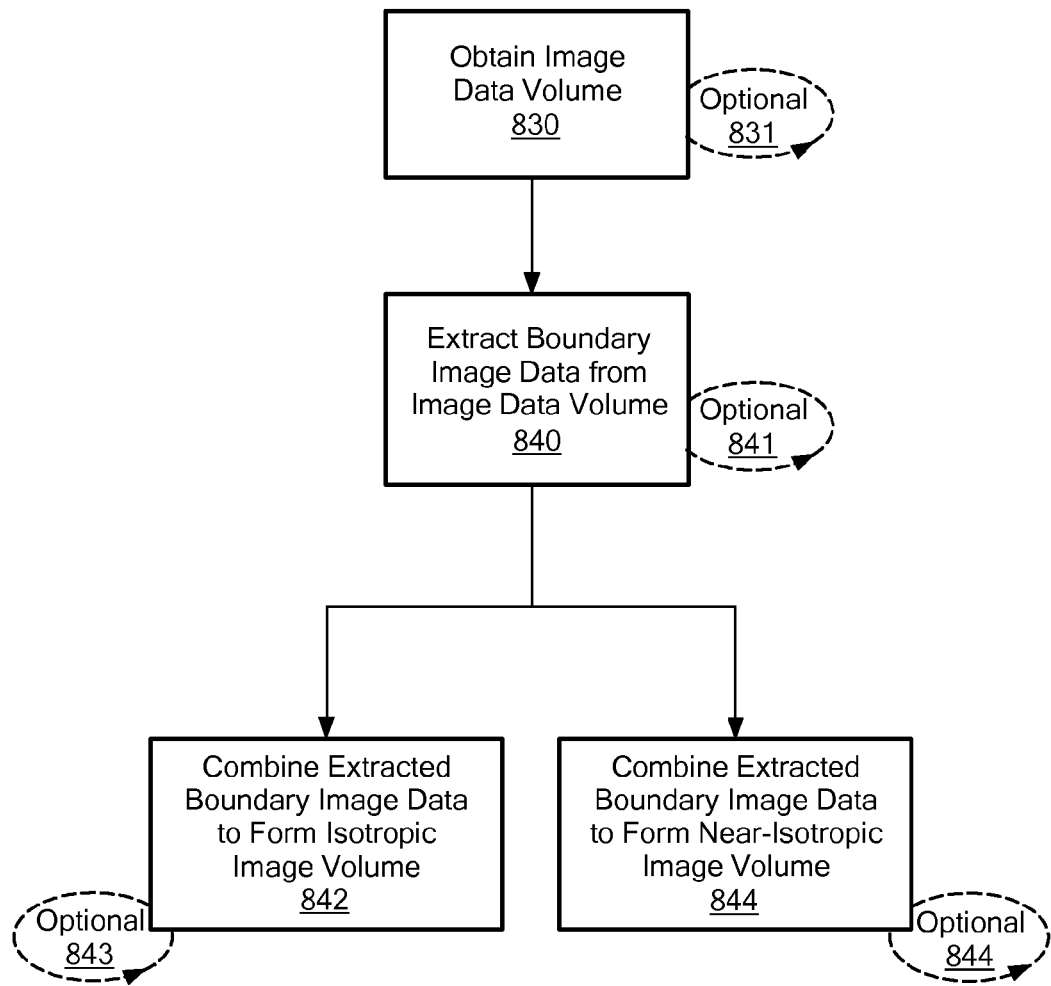

A method is also described for producing isotropic or near-isotropic image volume from images. This method is shown in FIG. 8B. The first step is to obtain an image data volume 830. As shown by optional repeat step 831, this step can be repeated such that multiple image data volumes are obtained. Once the image data volume or volumes have been obtained boundary image data is extracted 840. The extraction process can be repeated one or more times, as desired, 841. The extracted data volumes are combined to form isotropic image volumes 842, or near-isotropic image volumes 844. As will be appreciated by those of skill in the art, more than one volume can be generated based on the extracted boundary image data 843, 845, if desired.

Figure 8C:
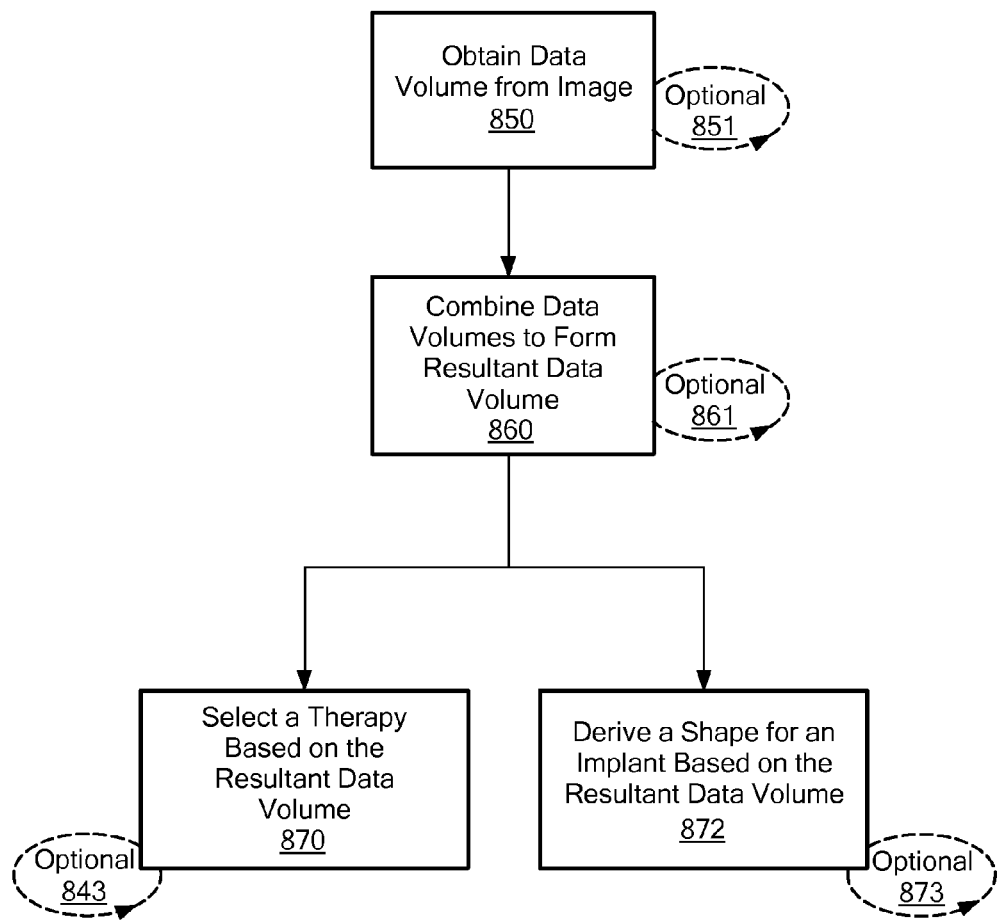

Another method is provided shown in FIG. 8C. This method includes the step of obtaining data volume from an image 850, a process that can optionally be repeated 851, if desired. Once the data volume is obtained, the data volume are combined to form at least one resultant data volume 860. More than one resultant data volume can be obtained 861, if desired. After obtaining the resultant data volume 860, a therapy can be selected based on the data volume 870 or a shape of an implant can be selected or derived 872. Either or both of these steps can be repeated, if desired, 871, 873.

Figure 7:
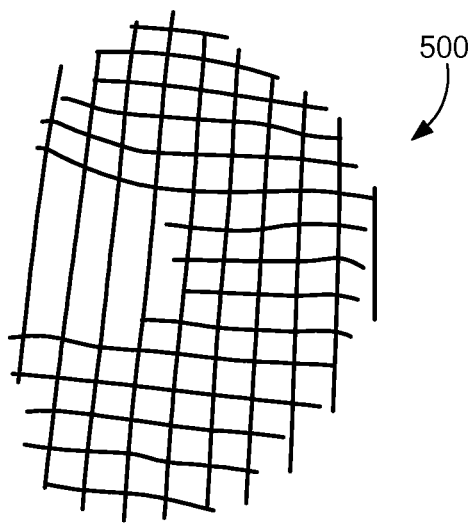
FIG. 7 illustrates a three-dimensional implant design generated from at least two image scans.

Referring now to FIG. 7 there is shown an implant design 500 generated by the methods in accordance with the present invention, wherein three-dimensional surface has been generated according the methods of the present invention. This three dimensional surface can then be utilized to manufacture an implant or select a therapy including an implant. Examples of such implants and implant techniques can be seen in co-pending U.S. patent application Ser. No. 10/724,010, filed on Nov. 25, 2003 by Aaron Berez, et al., for "Patient Selectable Joint Arthroplasty Devices and Surgical Tools Facilitating Increased Accuracy, Speed and Simplicity in Performing Total and Partial Joint Arthroplasty," the entirety of which is herein incorporated by reference.

Alternatively, it may be determined after having generated a three-dimensional surface such as that shown in FIG. 7, that this type of implant is not necessary or cannot be utilized. Thus, a therapy may be chosen as an alternative or in addition to this type of implant. Examples of therapies include: drug therapy such as pain medication, chondroprotective agents, chondroregenerative agents, bone protective agents, bone regenerating agents, bone anabolic agents, bone osteoclast inhibiting agents, injections of hyaluronic acid or chondroitin sulfates or other drugs or bioactive substances into the joint, osteotomy, chondral or osteochondral autografts or allografts, or other types of implants. Other types of implants can include, for example, total or unicompartmental arthroplasty devices.

The methods present herein can be utilized at different timepoints, e.g. a timepoint T1 and a later or earlier timepoint T2. These timepoints can occur, for example, within one imaging session on a single day, or can occur over multiple imaging sessions over multiple days. The time span can further be hours, days, weeks, months and years. Tissues can then be characterized using quantitative measurements of the resultant data volumes V1 and V2 and changes in tissue composition or relative or absolute quantities can be assessed.

The instant invention is shown and described herein in what is considered to be the most practical, and preferred embodiments. It is recognized, however, that departures may be made there from, which are within the scope of the invention, and that obvious modifications will occur to one skilled in the art upon reading this disclosure.

We claim:

1. A method of making a joint replacement system for repairing a joint of a patient, including:
   obtaining data of a first image volume of the patient;
   obtaining data of a second image volume of the patient;
   transforming the data of the first image volume and the data of the second image volume into a common coordinate system, wherein the data referenced in the common coordinate system are used to design a surgical tool for use in repairing the joint of the patient; and
   making the joint repair system including the designed surgical tool.

2. The method of claim 1, wherein the data referenced in the common coordinate system are used to design an implant for replacing at least a portion of the joint of the patient.

3. The method of claim 1, wherein the data referenced in the common coordinate system are used to select an implant for replacing at least a portion of the joint of the patient.

4. The method of claim 1, including using anatomical landmarks for said transforming of the data of the first image volume and the data of the second image volume into said common coordinate system.

5. The method of claim 1, wherein said transforming of the data of the first image volume and the data of the second image volume into said common coordinate system is achieved with use of user defined landmarks.

6. The method of claim 1, wherein said transforming of the data of the first image volume and the data of the second image volume into a common coordinate system is achieved with use of a priori knowledge.

7. The method of claim 6, wherein said a priori knowledge includes knowledge of the image position.

8. The method of claim 6, wherein said a priori knowledge include knowledge of the image orientation.

9. The method of claim 1, wherein the data of the first image volume is image data selected from the group consisting of x-ray, CT, spiral CT and MRI image data, and wherein the data of the second image volume is image data selected from the group consisting of x-ray, CT, spiral CT and MRI image data.

10. The method of claim 1, where the data of the first image volume and the data of the second image volume are obtained from two different planes.

11. The method of claim 1, further comprising performing at least one or more segmentations of data, wherein data referenced in the common coordinate system and generated by the segmentation are used to design the surgical tool.

12. The method of claim 1, further comprising performing at least one or more segmentations of data, wherein data referenced in the common coordinate system and generated by the segmentation are used to select the joint replacement system.

* * * * *